United States Patent [19]
Sumita et al.

[11] Patent Number: 5,764,091
[45] Date of Patent: Jun. 9, 1998

[54] METHOD AND SYSTEM FOR CLOCK-SIGNAL WAVEFORM CORRECTION

[75] Inventors: Masaya Sumita; Jiro Miyake, both of Osaka, Japan

[73] Assignee: Matsushita Electric Industrial Co., Ltd., Osaka, Japan

[21] Appl. No.: 590,573

[22] Filed: Jan. 24, 1996

[30] Foreign Application Priority Data

Jan. 25, 1995 [JP] Japan ................................. 7-009436

[51] Int. Cl.$^6$ ........................................... H03K 3/017
[52] U.S. Cl. ........................... 327/175; 327/154; 327/176; 326/93
[58] Field of Search ................................. 327/172, 173, 327/174, 175, 176, 292, 298, 144, 145, 154; 326/93, 96; 331/25

[56] References Cited

U.S. PATENT DOCUMENTS

| | | | |
|---|---|---|---|
| 4,623,846 | 11/1986 | Lamacchia | 327/172 |
| 5,008,636 | 4/1991 | Markinson et al. | 331/25 |
| 5,070,254 | 12/1991 | Summers | 327/100 |
| 5,506,878 | 4/1996 | Chiang | 327/151 |
| 5,614,855 | 3/1997 | Lee et al. | 327/175 |

FOREIGN PATENT DOCUMENTS 57-150230  9/1982  Japan ................................. 327/154

*Primary Examiner*—Kenneth B. Wells
*Attorney, Agent, or Firm*—McDermott, Will & Emery

[57] ABSTRACT

A duty ratio-guaranteed reference clock signal and a duty ratio-unguaranteed drive clock signal serve as input to a clock signal waveform-correcting system in accordance with this invention. The system thereafter puts out a post-correction drive clock signal that is duty ratio-guaranteed. The system has a phase comparator and a switch circuit. The phase comparator puts out a HIGH signal as long as the reference clock signal and the drive clock signal disagree in logical level. The switch circuit transmits an inverted signal as a result of inverting the drive clock signal, to an output signal of a first buffer to which the drive clock signal is applied. A second buffer takes in the output signal and puts out a post-correction drive clock signal.

15 Claims, 19 Drawing Sheets

CLOCK SIGNAL WAVEFORM CORRECTION SYSTEM

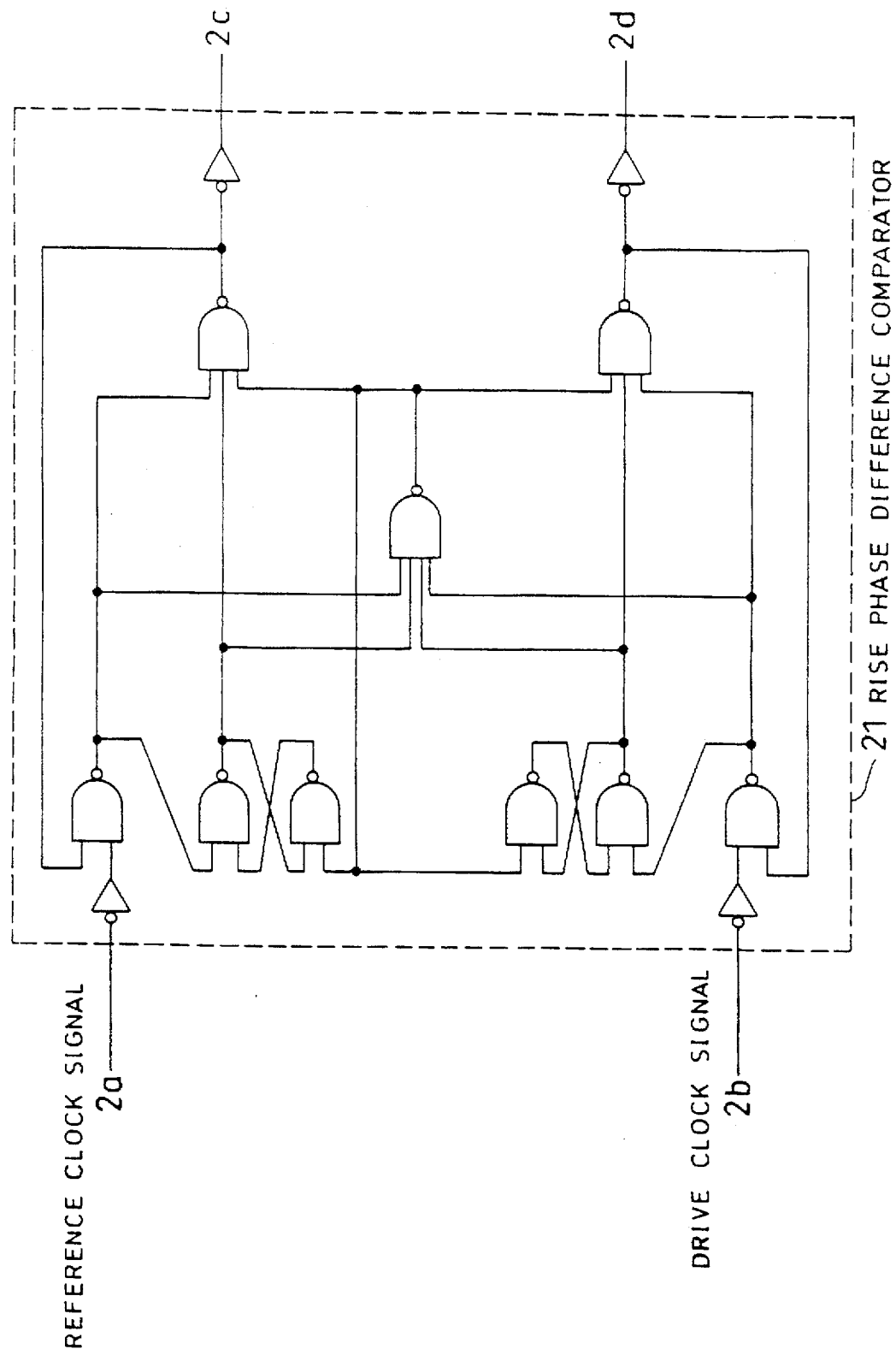

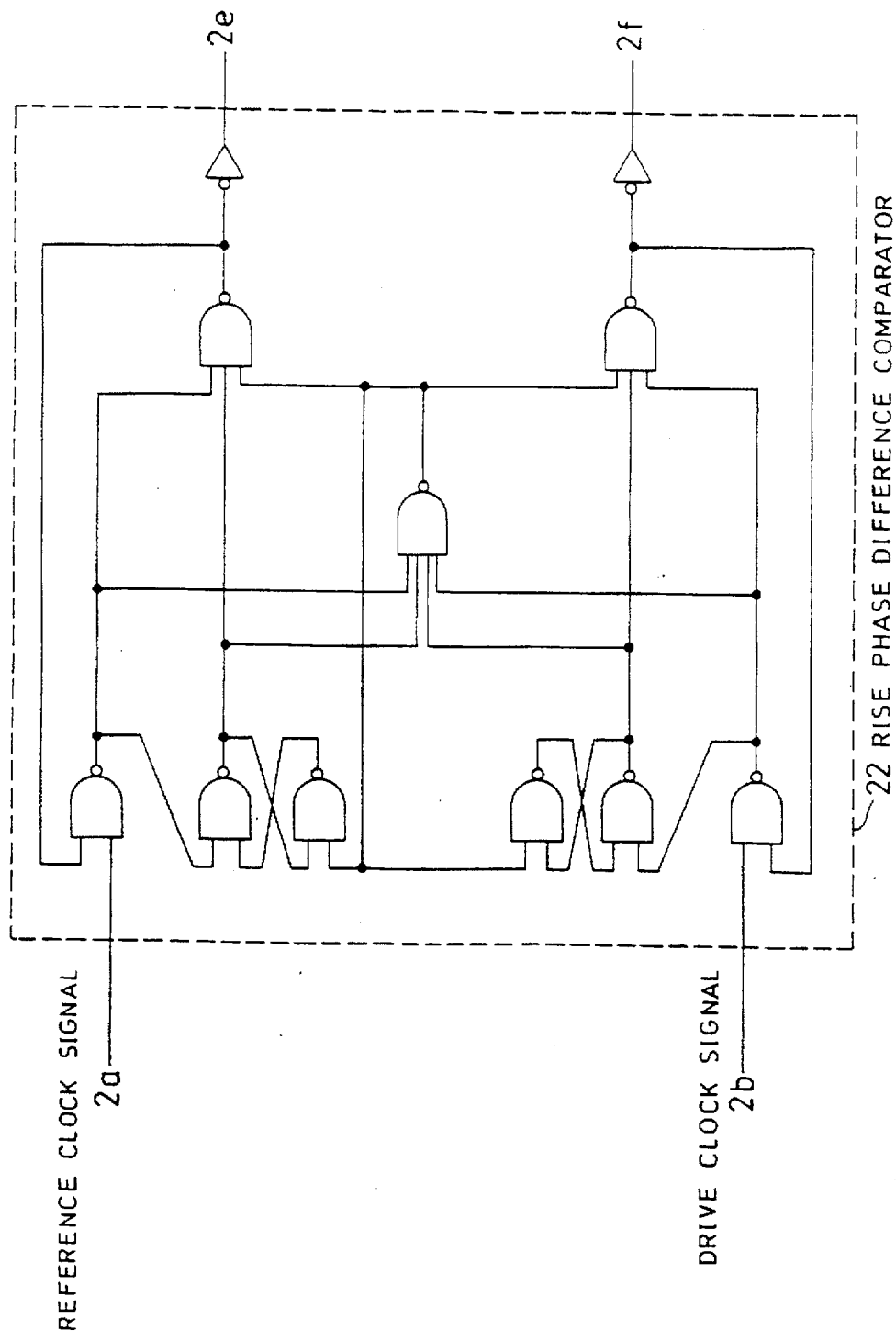

PRIOR ART

PRIOR ART

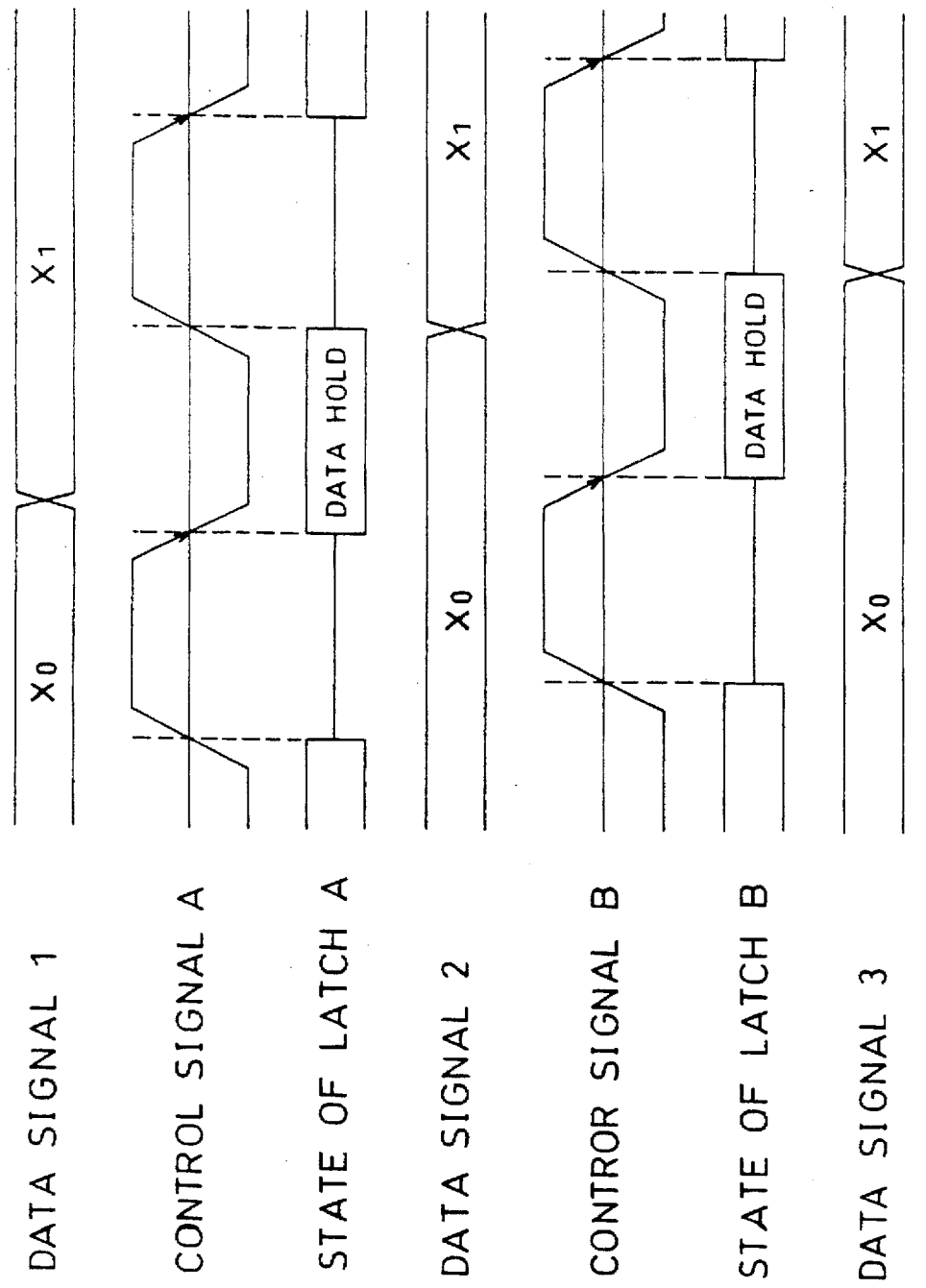

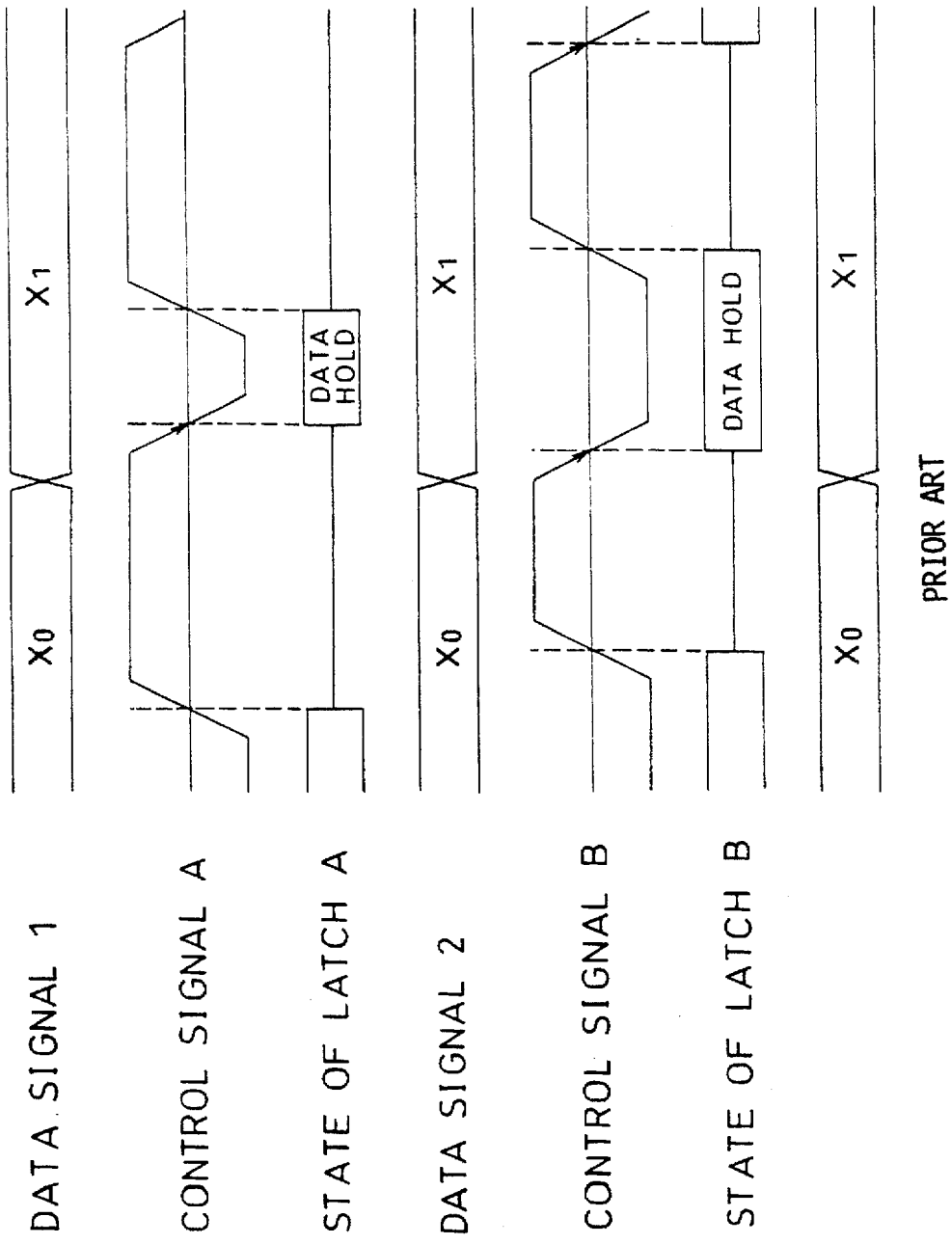

METHOD AND SYSTEM FOR CLOCK-SIGNAL WAVEFORM CORRECTION

BACKGROUND OF THE INVENTION

This invention is directed to a method and system for correcting circuit-drive clock signal waveforms. Particularly, this invention pertains to a method and system for correcting the duty ratio of a circuit-drive clock signal on the basis of a reference clock signal.

Conventionally, the application of clock signals to, for example, large-scale integrated circuits has been achieved as follows. That is, a clock generator, formed on the chip, generates a duty ratio-guaranteed reference clock signal. A signal line for that reference clock signal is buffered, whereupon the generated clock signal is delivered to individual circuit blocks so as to drive them.

The clock-signal duty ratio (CDR) is explained below.

FIG. 15(a) depicts a buffer circuit with a simple structure. This buffer circuit is made up of three, in-series inverters 41, 42, 43 having the same transistor size. The inverters 41, 42, 43 have their respective output signal lines having wire capacitances C0, C1, and C2, respectively. FIG. 15(b) depicts waveforms of output signals of the inverters 41, 42, 43 resulting from application of a clock signal to the FIG. 15(a) circuit. IN denotes the output of the inverter 41. SIG1 denotes the output of the inverter 42. OUT denotes the output of the inverter 43.

The duty ratio is the ratio of assigned signal transmission time to actual pulse duration time. For example, in the case of the waveform of SIGNAL IN (i.e., the output of the inverter 41), the duty ratio is the ratio of $a_{in}$ to $c_{in}$, where $c_{in}=a_{in}+b_{in}$. In the case of the waveform of SIGNAL OUT (i.e., the output of the inverter 43), the duty ratio is the ratio of $a_{out}$ to $c_{out}$.

If it is here assumed that SIGNAL IN has a duty ratio of 50%, then $a_{in}$ is ½ of $c_{in}$, in other words $a_{in}$ is equal to $b_{in}$. At this time, if C0=C1=C2, then $a_{out}=b_{out}$. Therefore, the duty ratio of SIGNAL OUT remains unchanged (i.e., 50%).

Prior art techniques have the following drawbacks.

FIG. 16 differs from FIG. 15(b) in that it depicts other waveforms of the inverters 41, 42, 43 of the FIG. 15(a) circuit with different C0, C1, and C2.

If C1>C0, SIGNAL SIG1 undergoes a gentle rise (fall) in comparison with SIGNAL IN. At this time, if C2=C0, SIGNAL OUT undergoes a rise (fall) forming the same rise (fall) angle as SIGNAL IN; however, $a_{out}$ becomes greater than $b_{out}$ and SIGNAL OUT comes to have a duty ratio of above 50%. On the other hand, if C2<C0, then SIGNAL OUT undergoes an abrupt rise (fall) in comparison with SIGNAL IN; however, $a_{out}$ becomes greater than $b_{out}$ and SIGNAL OUT comes to have a duty ratio of above 50%. The CDR is not guaranteed accordingly.

To guarantee the CDR, the size of transistor of each node forming a circuit, and the wire capacitance must be designed adequately. This produces the problem that, in the actual ASIC design or in the design using standard cells, it is extremely difficult to design the transistor size of each node, in consideration of the wire capacitance to guarantee the CDR. This is because of recent very high-density digital circuits in which the wire-to-wire distance is only several micrometers, in other words it is almost impossible to obtain a correct estimate of the wire-to-wire capacitance.

Problems resulting from the fact that the CDR is not guaranteed are illustrated by taking an example of the data mislatch.

FIG. 17 is a block diagram of a data bus for data transmission. As long as a control signal A is HIGH, a latch A takes in data and puts out the data with no changes, in other words the input data is outputted intact from the latch A. The latch A latches data inputted thereto when CONTROL SIGNAL A falls, and holds that input data until the next rise of CONTROL SIGNAL A takes place. As long as a control signal B is HIGH, a latch B takes in data and puts out the data with no changes, that is, the input data is outputted intact from the latch B. The latch B latches data inputted thereto when CONTROL SIGNAL B falls, and holds that input data until the next rise of CONTROL SIGNAL B takes place. If clock signals are inputted so as to serve as CONTROL SIGNALS A and B, this enables sequential transfer of data.

FIG. 18 is a timing diagram of the FIG. 16 data bus when it normally operates. When a data signal 1 makes a transition from $X_0$ to $X_1$, the latch A, since CONTROL SIGNAL A is LOW, is placed in the state of DATA HOLD and hence a data signal 2 stays in the same state (i.e., $X_0$). When CONTROL SIGNAL A rises, the latch A leaves DATA HOLD STATE and, as a result, DATA SIGNAL 2 makes a transition to $X_1$. At this instant, the latch B, since CONTROL SIGNAL B is LOW, is placed in DATA HOLD STATE. Because of this, a data signal 3 stays in the same state (i.e., $X_0$). When CONTROL SIGNAL B rises, the latch B is released from being in DATA HOLD STATE and, as a result, DATA SIGNAL 3 makes a transition to $X_1$.

In spite of the above-described arrangements, malfunctions are likely to occur owing to CDR variation.

FIG. 19 is a timing diagram when the duty ratio of CONTROL SIGNAL A becomes great. When DATA SIGNAL 1 makes a transition from $X_0$ to $X_1$ on the same timing as shown in FIG. 16, CONTROL SIGNAL A, due to having a great duty ratio, has not yet risen. DATA SIGNAL 2 results in making a transition to $X_1$ because of the fact that the latch A has not yet entered DATA HOLD STATE. At this instant, the latch B, likewise, has not yet entered DATA HOLD STATE and, as a result, DATA SIGNAL 3 is forced to make a transition to $X_1$. In other words, data mislatch occurs, since the CDR is not guaranteed.

SUMMARY OF THE INVENTION

Bearing in mind the above-noted problems with the prior art techniques, the present invention was made. Therefore it is a general object of this invention to provide a method and system for correcting the waveform of clock signals. More specifically, the waveform of a drive clock signal, the duty ratio of which is not guaranteed, is corrected by making use of a duty ratio-guaranteed reference clock signal in such a way that the duty ratio of the drive clock signal is matched with the duty ratio of the reference clock signal.

The present invention provides a clock signal waveform-correcting system. This system comprises:

a first means for detecting at least one of a rise phase difference between the reference clock signal and the drive clock signal and a fall phase difference between the reference clock signal and the drive clock signal, and for showing a length of time during which the reference clock signal and the drive clock signal disagree in phase;

a second means for applying to the drive clock signal either a charge force or a decharge force for the length of time.

As a result of such application of a charge or decharge force to the drive clock signal, the duty ratio of the drive clock signal is matched with that of the reference clock signal. In this way, the duty ratio of the drive clock signal is guaranteed.

It is preferred that the first means is formed by a phase comparator capable of making a comparison in logical level between the reference clock signal and the drive clock signal so as to provide a pulse signal indicative of a length of time during which the reference clock signal and the drive clock signal disagree in logical level, and that the second means has a signal inverting circuit which inverts the drive clock signal to produce an inverted signal, and a switch circuit which allows the inverted signal to be transmitted to a signal line for the drive clock signal, just for the length of time indicated by the pulse signal of the phase comparator.

As described above, the drive clock signal is compared in logical level with the reference clock signal, and as long as they disagree in logical level, the drive clock signal is overlapped with its inverse. As a result, the duty ratio of the drive clock signal can easily be matched with that of the reference clock signal.

It is preferred that the first means includes:

(a) a rise phase comparator capable of:
  making a comparison in rise timing between the reference clock signal and the drive clock signal;
  providing a first pulse signal indicative of a first length of time during which the reference clock signal is in the rise state and, at the same time, the drive clock signal is out of the rise state, and a second pulse signal indicative of a second length of time during which the drive clock signal is in the rise state and, at the same time, the reference clock signal is out of the rise state;

(b) a fall phase comparator capable of:
  making a comparison in fall timing between the reference clock signal and the drive clock signal;
  providing a third pulse signal indicative of a third length of time during which the reference clock signal is in the fall state and, at the same time, the drive clock signal is out of the fall state, and a fourth pulse signal indicative of a fourth length of time during which the drive clock signal is in the fall state and, at the same time, the reference clock signal is out of the fall state;

the second means including:

(c) first electric current supply means for charging up a signal line for the drive clock signal just for the first length of time;

(d) second electric current supply means for decharging the signal line just for the second length of time;

(e) third electric current supply means for decharging the signal line just for the third length of time;

(f) fourth electric current supply means for charging up the signal line just for the fourth length of time.

In accordance with the above-described arrangement, the drive clock signal is compared in rise timing with the reference clock signal. The signal line of the drive clock signal is charged for a certain length of time during which the reference clock signal is in the rise state of and, at the same time, the drive clock signal is out of the rise state. On the other hand, the signal line is decharged for a certain length of time during which the drive clock signal is in the rise sate, and, at the same time, the reference clock signal is out of the rise state. Additionally, the drive clock signal is compared in fall timing with the reference clock signal. The signal line of the drive clock signal is decharged for a certain length of time during which the reference clock signal is in the fall state and, at the same time, the drive clock signal is out of the fall state. On the other hand, the signal line is charged for a certain length of time during which the drive clock signal is in the fall state and, at the same time, the reference clock signal is out of the fall state.

It is preferred that the first means includes:

a first circuit for making a comparison in logical level between the reference clock signal and the drive clock signal, and for providing a first pulse signal indicative of a first length of time during which the reference clock signal is at the logical level of HIGH and, at the same time, the drive clock signal is at the logical level of LOW;

a second circuit for making a comparison in logical level between the reference clock signal and the drive clock signal, and for providing a second pulse signal indicative of a second length of time during which the reference clock signal is at the logical level of LOW and, at the same time, the drive clock signal is at the logical level of HIGH; and that the second means includes:

first electric current supply means for charging up a signal line for the drive clock signal, just for the first length of time;

second electric current supply means for decharging the signal line, just for the second length of time.

In accordance with the above-described arrangement, the drive clock signal is compared in logical level with the reference clock signal. The drive clock signal is charged for a certain length of time during which the reference clock signal is at the logical level of HIGH and, at the same time, the drive clock signal is at the logical level of LOW. On the other hand, the drive clock signal is decharged for a certain length of time during which the reference clock signal is at the logical level of LOW and, ad the same time, the drive clock signal is at the logical level of HIGH.

BRIEF DESCRIPTION OF THE DRAWINGS

FIG. 7 illustrates the structure of a rise phase comparator of the second embodiment CSWS.

FIG. 8 illustrates the structure of a fall phase comparator of the second embodiment CSWS.

FIG. 15 comprises FIG. 15(a) and FIG. 15(b) wherein FIG. 15(a) shows a circuit diagram of a buffer with a simple structure while

FIG. 18 is a timing diagram of the operation of the FIG. 15 data bus.

FIG. 19 is another timing diagram of the operation of the FIG. 17 data bus.

DETAILED DESCRIPTION OF THE INVENTION

Figure 1:
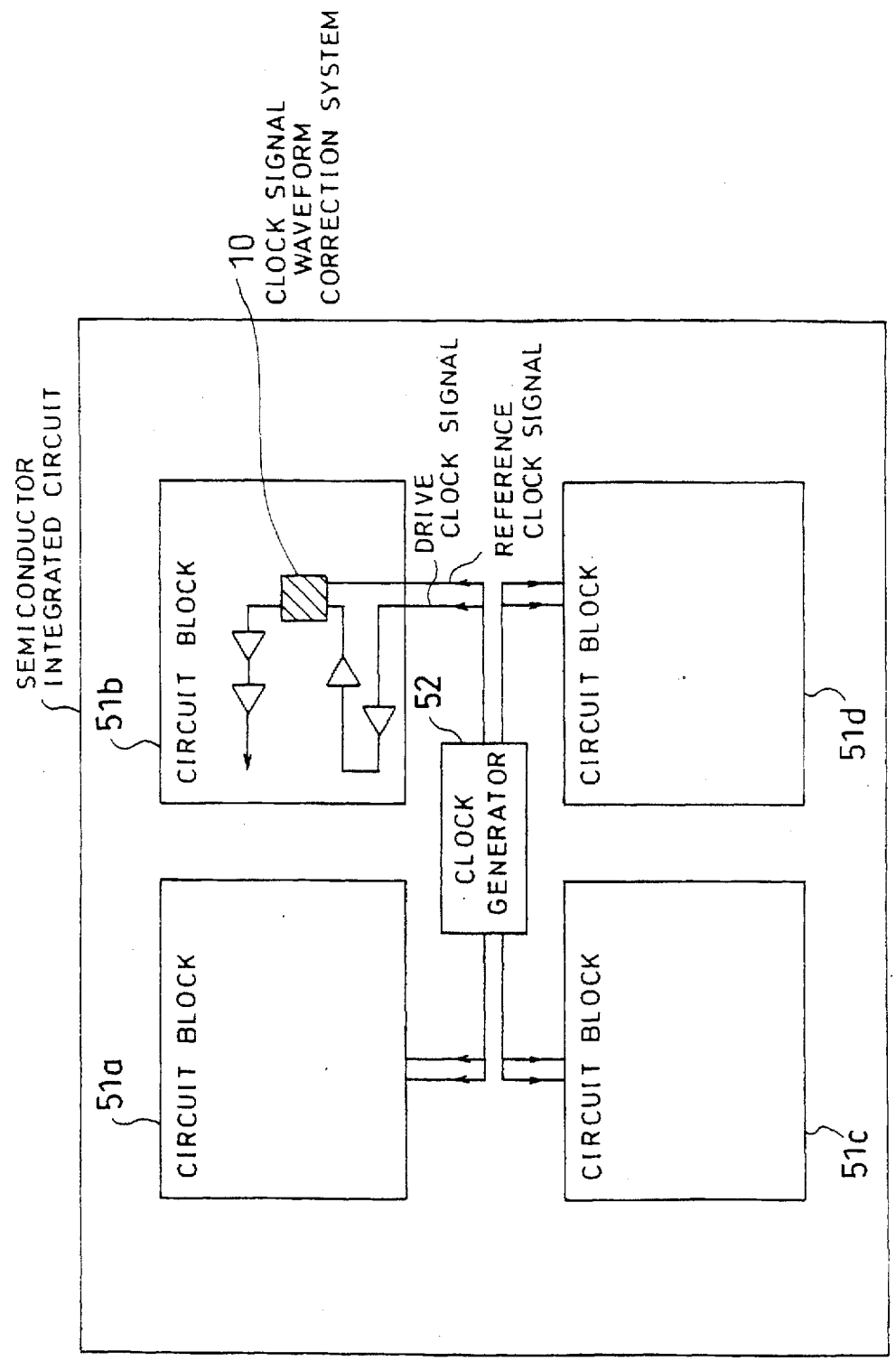
FIG. 1 is a schematic diagram of a semiconductor integrated circuit including a clock signal waveform-correcting system (CSWS) in accordance with the present invention.

Referring first to FIG. 1, a CSWS in accordance with this invention is illustrated.

As shown in FIG. 1, circuit blocks 51a, 51b, 51c, and 51d, and a clock generator 52 are provided in the semiconductor integrated circuit. Each circuit block 51a, 51b, 51c, 51d is fed a drive clock signal generated in the clock generator 52. Such a drive clock signal works to control the operation of each circuit block 51a, 51b, 51c, and 51d.

Arranged within the circuit block 51b is a CSWS 10. As explained previously, when a drive clock signal is transmitted via a buffer to individual circuits, the duty ratio thereof becomes unguaranteed owing to the transistor size of each node and the wire capacitance. The CSWS 10 receives both a drive clock signal the duty ratio of which has become unguaranteed and a duty ratio-guaranteed reference clock signal, whereupon the drive clock signal is waveform-corrected. In this way, the CSWS 10 is able to provide a duty ratio-guaranteed drive clock signal.

Preferred embodiments of the present invention are described with reference to the accompanying drawing figures.

EMBODIMENT 1

Figure 2:
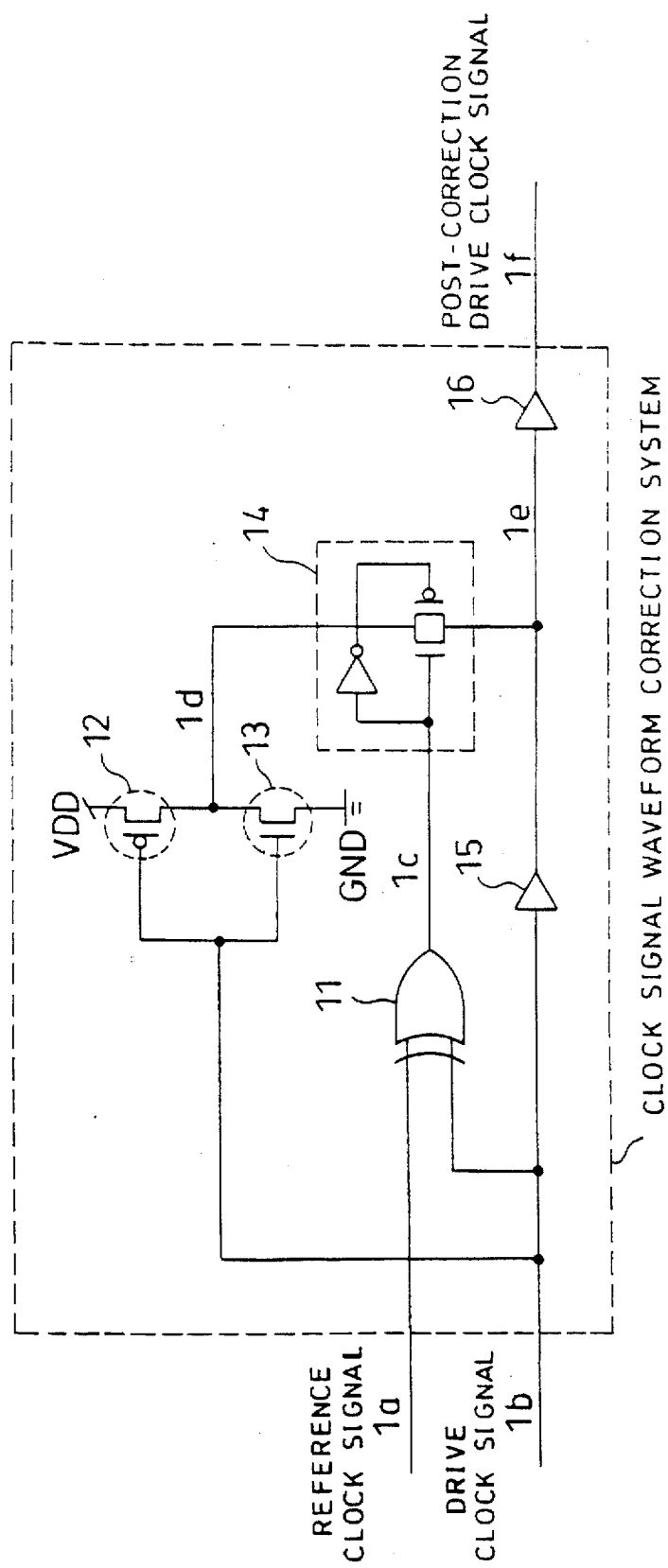
FIG. 2 is a diagram illustrating the structure of a CSWS in accordance with a first embodiment of the present invention.

FIG. 2 shows the structure of a CSWS in accordance with a first embodiment of the present invention. 11 is a phase comparator. 12 is a p-channel MOS transistor. 13 is an n-channel MOS transistor. 14 is a switch circuit. 15 is a first buffer. 16 is a second buffer. The PMOS transistor 12 and the NMOS transistor 13 together form a signal-inverting circuit.

1a denotes a reference clock signal (RCS) generated by the clock generator while 1b denotes a duty ratio-unguaranteed drive clock signal (DCS).

The phase comparator 11 forms an XOR (exclusive OR) circuit. The phase comparator 11 takes in both RCS 1a and DCS 1b and performs an XOR operation of RCS 1a and DCS 1b, to put out a pulse signal 1c indicative of the result of the XOR operation.

The source of the PMOS transistor 12 is linked to a supply of power. DCS 1b is applied at the gate of the PMOS transistor 12. The source of the NMOS transistor 13 is grounded. DCS 1b is applied at the gate of the NMOS transistor 13. The drain of the PMOS transistor 12 and the drain of the NMOS transistor 13 are connected together and, from the joint point of the drains, a signal 1d, which is an inverse of DCS 1b, is applied to the switch circuit 14.

The switch circuit 14 is on-off controlled by PULSE SIGNAL 1c. More specifically, when PULSE SIGNAL 1c is HIGH, the switch circuit 14 turns on and puts out INVERTED SIGNAL 1d. On the other hand, when PULSE SIGNAL 1c is LOW, the switch circuit 14 turns off and no INVERTED SIGNAL 1d is outputted.

The first buffer 15 is fed DCS 1b. The output signal line of the first buffer 15 and the output signal line of the switch circuit 14 are linked together. The second buffer 16 takes in an output signal 1e of the first buffer 15 and puts out a post-correction drive clock signal (PDCS) 1f.

The operation of the present CSWS having the above-described structure will now be explained.

Figure 3:
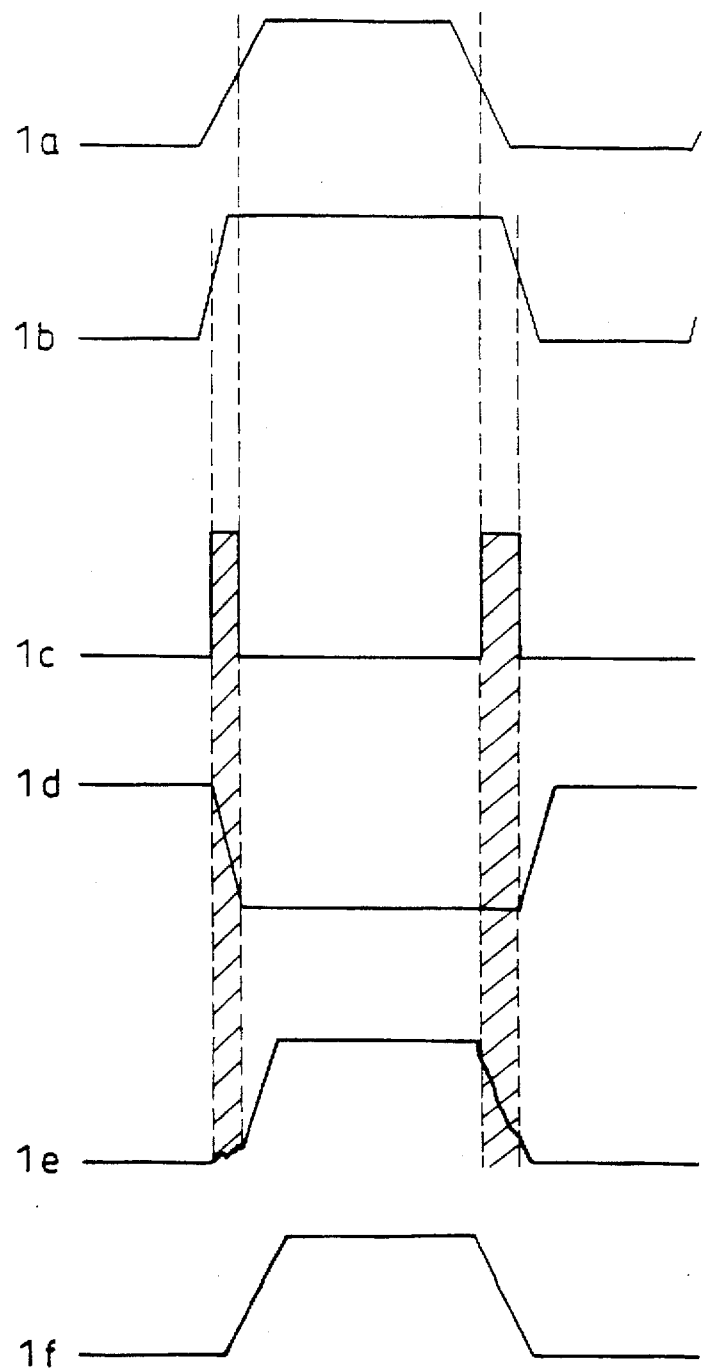
FIG. 3 depicts signal waveforms of the first embodiment CSWS.

FIG. 3 depicts signal waveforms of the present CSWS when the duty ratio of DCS 1b is greater than the duty ratio of RCS 1a.

The phase comparator 11 performs an XOR operation of RCS 1a and DCS 1b, and PULSE SIGNAL 1c is provided. In other words, PULSE SIGNAL 1c stays HIGH, just for a certain length of time during which there exists a difference in rise timing or fall timing between RCS 1a and DCS 1b.

As long as PULSE SIGNAL 1c is HIGH, the switch circuit 14 is held in the state of ON, and INVERTED SIGNAL 1d, which is an inverse of DCS 1b, is transmitted to OUTPUT SIGNAL 1e of the first buffer 15. As long as PULSE SIGNAL 1c indicates that there exists a difference in rise timing, the fall of INVERTED SIGNAL 1d is taking place. This results in application of a decharge (charge-down) force to OUTPUT SIGNAL 1e of the first buffer 15 and, as a result, INVERTED SIGNAL 1d is delayed in rise timing with respect to DCS 1b. As long as PULSE SIGNAL 1c indicates that there exists a difference in fall timing, INVERTED SIGNAL 1d is LOW. This results in application of a decharge force to OUTPUT SIGNAL 1e of the first buffer 15 and, as a result, INVERTED SIGNAL 1d is advanced in fall timing with respect to DCS 1b. As a result of such arrangement, the duty ratio of PDCS 1f becomes equal to the duty ratio of RCS 1a.

Figure 4:
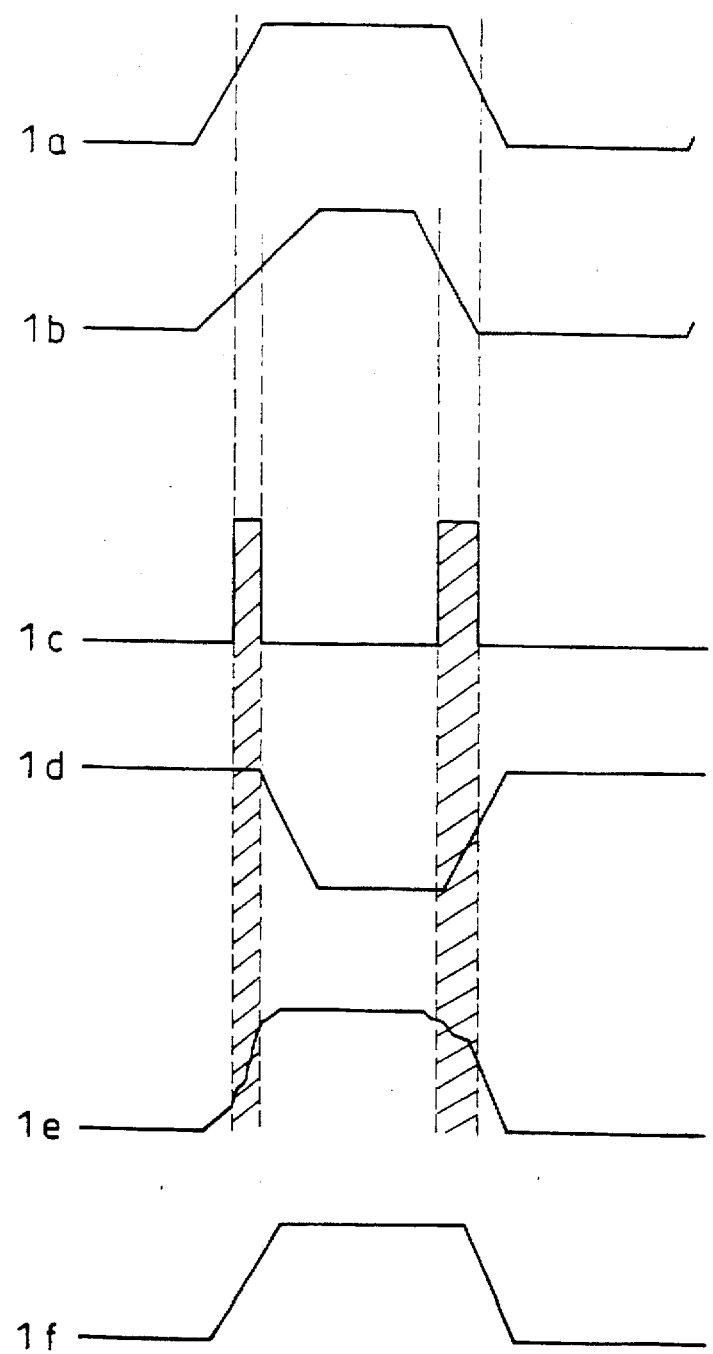
FIG. 4 depicts signal waveforms of the first embodiment CSWS.

FIG. 4 depicts signal waveforms of the present CSWS when the duty ratio of DCS 1b is lower than the duty ratio of RCS 1a.

The phase comparator 11 performs an XOR operation of RCS 1a and DCS 1b, and PULSE SIGNAL 1c is provided. In other words, PULSE SIGNAL 1c stays HIGH, just for a certain length of time during which there exists a difference in rise timing or fall timing between RCS 1a and DCS 1b. As long as PULSE SIGNAL 1c is HIGH, the switch circuit 14 is held in the state of ON, and INVERTED SIGNAL 1d, which is an inverse of DCS 1b, is transmitted to OUTPUT SIGNAL 1e of the first buffer 15. These operations are the same as FIG. 3.

As long as PULSE SIGNAL 1c indicates that there exists a difference in rising timing, INVERTED SIGNAL 1d is HIGH. This results in application of a charge force to OUTPUT SIGNAL 1e of the first buffer 15 and, as a result, INVERTED SIGNAL 1d is advanced in rise timing with respect to DCS 1b. As long as PULSE SIGNAL 1c indicates that there exists a difference in fall timing, the rise of INVERTED SIGNAL 1d takes place. This results in application of a charge force to OUTPUT SIGNAL 1e of the first buffer 15 and, as a result, INVERTED SIGNAL 1d is delayed in fall timing with respect to DCS 1b. As a result of such arrangement, the duty ratio of PDCS 1f becomes equal to the duty ratio of RCS 1a.

As described above, the duty ratio of DCS 1b is matched by the present embodiment with the duty ratio of RCS 1a.

Figure 5:
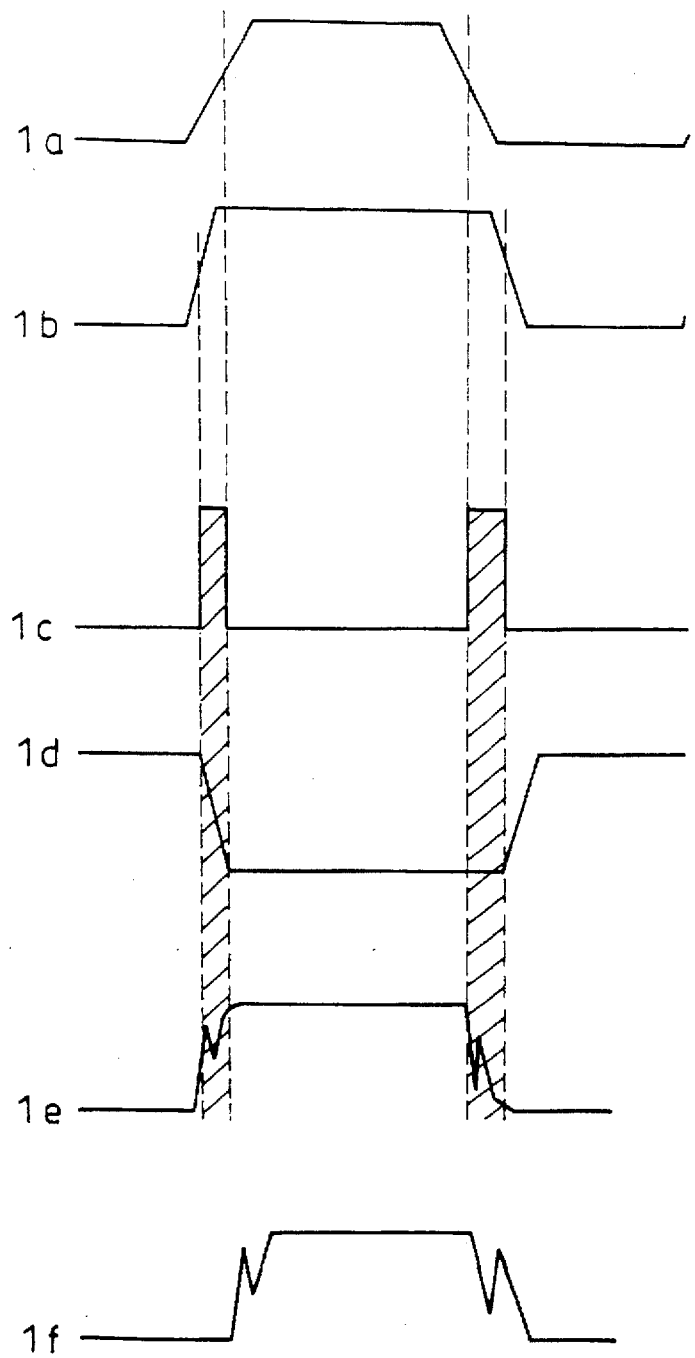
FIG. 5 depicts signal waveforms of the first embodiment CSWS.

It is however to be noted that the current driving force of the PMOS transistor 12 and the NMOS transistor 13 must be lower than that of the first buffer 15, otherwise noise occurs in OUTPUT SIGNAL 1e of the first buffer 15 (see FIG. 5) thereby producing circuit malfunction factors.

EMBODIMENT 2

Figure 6:
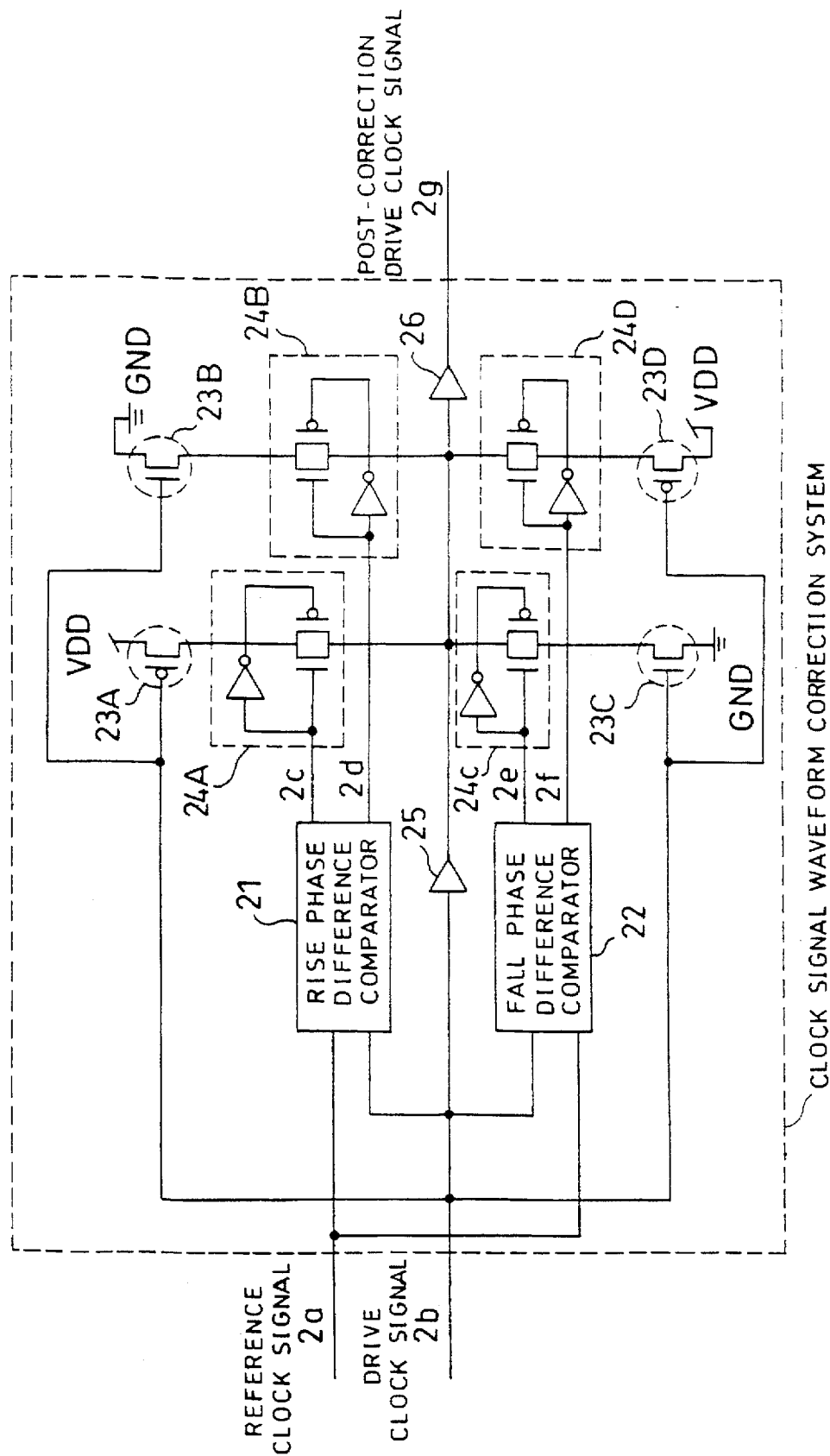
FIG. 6 illustrates the structure of a CSWS in accordance with a second embodiment of the present invention.

FIG. 6 illustrates the structure of a CSWS in accordance with a second embodiment of the present invention. 21 is a rise phase comparator. 22 is a fall phase comparator. 23A and 23D are PMOS transistors each serving as a source of electric current. 23B and 23C are NMOS transistors each serving as a source of electric current. 24A, 24B, 24C, and 24D are switch circuits. 25 is a first buffer. 26 is a second buffer. The PMOS transistor 23A and the switch circuit 24A together form a first electric current supply means. The NMOS transistor 23B and the switch circuit 24B together form a second electric current supply means. The NMOS transistor 23C and the switch circuit 24C together form a third electric current supply means. The PMOS transistor 23D and the switch circuit 24D together form a fourth electric current supply means.

2a denotes a reference clock signal (RCS) generated by the clock generator. 2b denotes a duty ratio-unguaranteed drive clock signal (DCS).

The rise phase comparator 21 is formed by, for example, the FIG. 7 circuit. This rise phase comparator 21 takes in RCS 2a and DCS 2b, makes a comparison in rise timing between the inputted clock signals, and puts out a pulse signal 2c and a pulse signal 2d. On the other hand, the fall phase comparator 22 is formed by, for example, the FIG. 8 circuit. This fall phase comparator 22, likewise, takes in RCS 2a and DCS 2b, makes a comparison in fall timing between the inputted clock signals, and puts out a pulse signal 2e and a pulse signal 2f.

The PMOS transistor 23A has a source that is linked to a supply of power, and a drain that is linked to the switch circuit 24A. The NMOS transistor 23B has a source that is grounded, and a drain that is linked to the switch circuit 24B. The NMOS transistor 23C has a source that is grounded, and a drain that is linked to the switch circuit 24C. The PMOS transistor 23D has a source that is linked to a supply of power, and a drain that is linked to the switch circuit 24D. DCS 2b is applied to the gates of the PMOS transistors 23A and 23D and to the gates of the NMOS transistors 23B and 23C.

The switch circuit 24A is on-off controlled according to the logical level (HIGH/LOW) of PULSE SIGNAL 2c. The switch circuit 24B is on-off controlled according to the logical level of PULSE SIGNAL 2d. The switch circuit 24C is on-off controlled according to the logical level of PULSE SIGNAL 2e. The switch circuit 24D is on-off controlled according to PULSE SIGNAL 2f.

The first buffer 25 takes in DCS 2b. The output signal line of the first buffer 25 is associated with the output signal lines of the switch circuits 24A–24D. On the other hand, the second buffer 26 takes in an output signal of the first buffer 25 and puts out a post-correction drive clock signal (PDCS) 2g.

The operation of a CSWS having the above-described structure is now explained below.

Figure 9A:
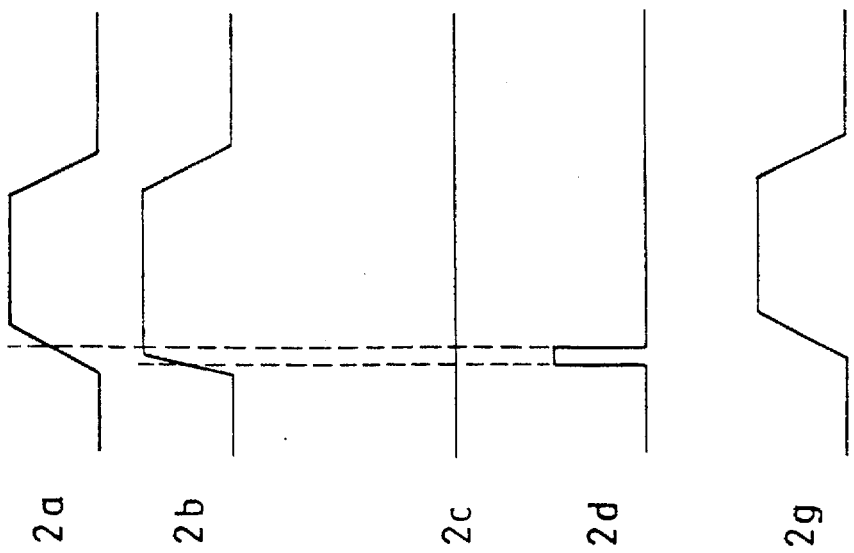
FIGS. 9(a) and (b) depict signal waveforms of the second embodiment CSWS.

FIG. 9(a) depicts signal waveforms of the present CSWS when the duty ratio of DCS 2b becomes lower than the duty ratio of RCS 2a because the former clock signal (i.e., DCS 2b) is delayed in rise timing with respect to the latter clock signal (i.e. RCS 2a).

PULSE SIGNAL 2c is held HIGH by the rise phase comparator 21 just for a proportional length of time to a rise timing difference between DCS 2b and RCS 2a, that is, just for a lag by which the former clock signal is delayed in rise timing with respect to the latter clock signal. PULSE SIGNAL 2d stays in the same logical state (i.e., LOW). As long as PULSE SIGNAL 2c is HIGH, the switch circuit 24A is held in the state of ON. At this time, a charge (charge-up) force is applied by the PMOS transistor 23A to the output signal line of the first buffer 25, therefore resulting in speeding the rise timing of PDCS 2g. This enables the duty ratio of PDCS 2g to become equal to the duty ratio of RCS 2a.

Figure 9B:
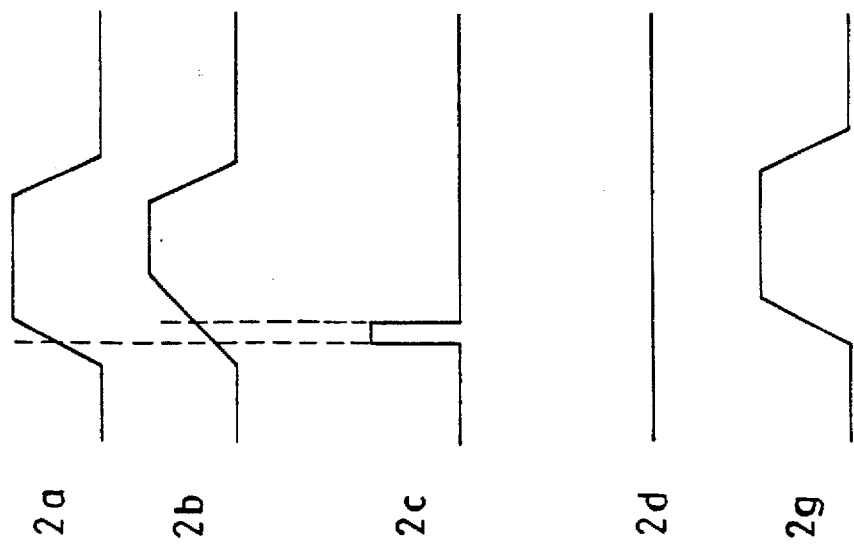

FIG. 9(b) depicts signal waveforms of the present CSWS when the duty ratio of DCS 2b becomes greater than the duty ratio of RCS 2a because the former clock signal is advanced in rise timing with respect to the latter clock signal 2a.

PULSE SIGNAL 2d is held HIGH by the rise phase comparator 21 just for a proportional length of time to a rise timing difference between DCS 2b and RCS 2a, that is, just for a lag by which the latter clock signal is delayed in rise timing with respect to the former clock signal. PULSE SIGNAL 2c stays in the same logical state (i.e., LOW). As long as PULSE SIGNAL 2d is HIGH, the switch circuit 24B is held in the state of ON. At this time, a decharge (charge-down) force is applied by the NMOS transistor 23B to the output signal line of the first buffer 25, therefore resulting in delaying the rise timing of the PDCS 2g. This enables the duty ratio of PDCS 2g to become equal to the duty ratio of RCS 2a.

Figure 10B:
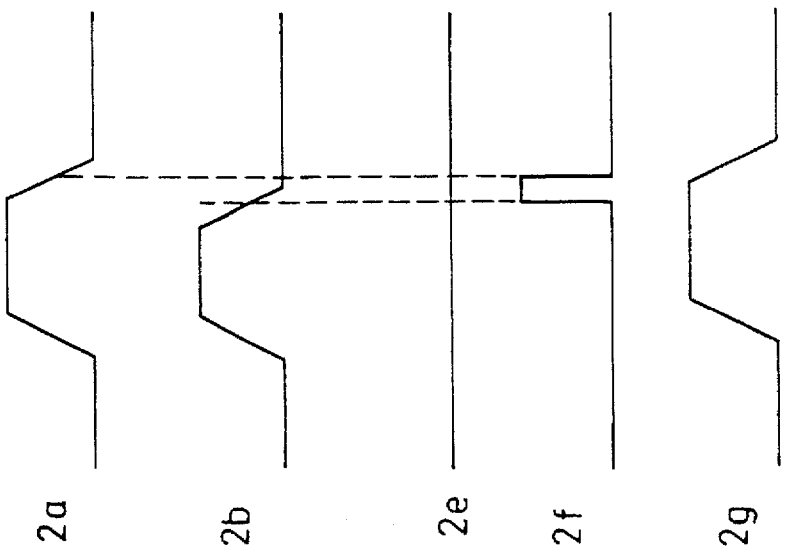
FIGS. 10(a) and (b) depict signal waveforms of the second embodiment CSWS.
Figure 10A:
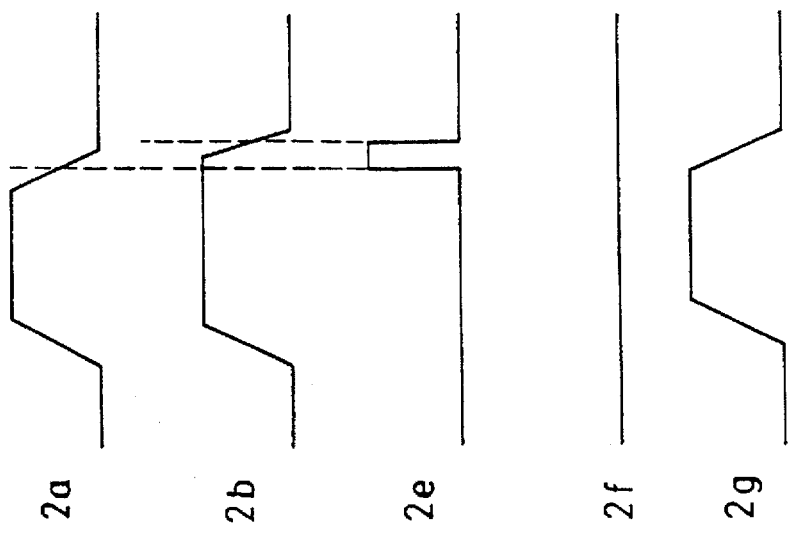

FIG. 10(a) depicts signal waveforms of the present CSWS when the duty ratio of DCS 2b becomes greater than the duty ratio of RCS 2a because the former clock signal is delayed in fall timing with respect to the latter clock signal.

PULSE SIGNAL 2e is held HIGH by the fall phase comparator 22 just for a proportional length of time to a fall timing difference between DCS 2b and RCS 2a, that is, just for a lag by which the former clock signal is delayed in fall timing with respect to the latter clock signal. PULSE SIGNAL 2f stays in the same logical state (i.e., LOW). As long as PULSE SIGNAL 2e is HIGH, the switch circuit 24C is held in the state of ON. At this time, a decharge force is applied by the NMOS transistor 23C to the output signal line of the first buffer 25, therefore resulting in speeding the fall timing of PDCS 2g. This enables the duty ratio of PDCS 2g to become equal to the duty ratio of RCS 2a.

FIG. 10(b) depicts signal waveforms of the present CSWS when the duty ratio of DCS 2b becomes lower than the duty ratio of RCS 2a because the former clock signal is advanced in fall timing with respect to the latter clock signal.

PULSE SIGNAL 2f is held HIGH by the fall phase comparator 22 just for a proportional length of time to a fall timing difference between DCS 2b and RCS 2a, that is, just for a lag by which the latter clock signal is delayed in fall timing with respect to the former clock signal. PULSE SIGNAL 2e stays in the same logical state (i.e., LOW). As long as PULSE SIGNAL 2f is HIGH, the switch circuit 24D is held in the state of ON. At this time, a charge force is applied by the PMOS transistor 23D to the output signal line of the first buffer 25, therefore resulting in delaying the fall timing of PDCS 2g. This enables the duty ratio of PDCS 2g to become equal to the duty ratio of RCS 2a.

As described above, the present embodiment enables the duty ratio of the drive clock signal to become equal to the duty ratio of the reference clock signal. The present embodiment employs a relatively complicated structure in comparison with the first embodiment; however, clock signal phase compare is made at a higher accuracy so that higher-accuracy duty ratio correction can be achieved.

The present embodiment shows a system capable of correcting the rise timing and fall timing of the clock signal. A system capable of correcting either one of the rise timing and fall timing may be realized.

EMBODIMENT 3

Figure 11:
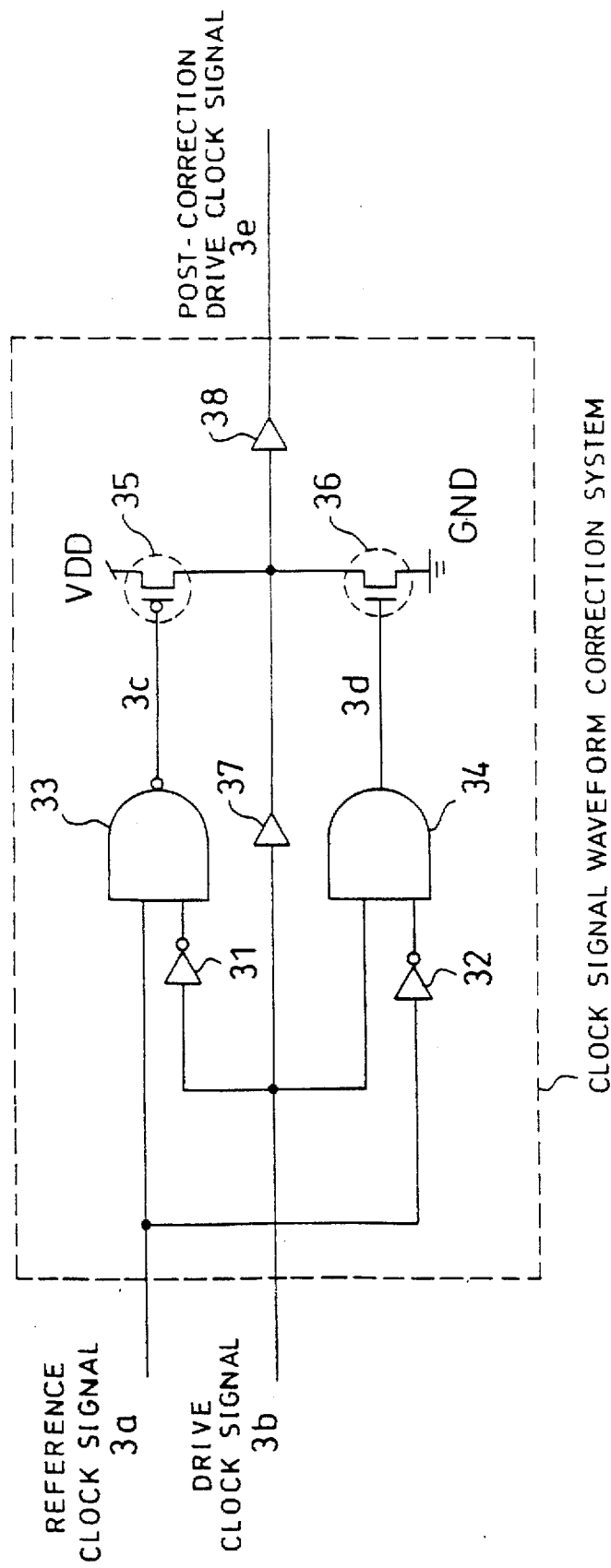
FIG. 11 illustrates the structure of a CSWS in accordance with a third embodiment of the present invention.

FIG. 11 is a circuit diagram of a CSWS in accordance with a third embodiment of the present invention. 31 and 32 are inverting circuits. 33 is a NAND circuit. 34 is an AND circuit. 35 is a PMOS transistor. 36 is an NMOS transistor. 37 is a first buffer. 38 is a second buffer.

3a is a reference clock signal (RCS) generated by the clock generator. 3b is a duty ratio-unguaranteed drive clock signal (RCS).

The inverting circuit 31 takes in DCS 3b and puts out an inverse thereof. Likewise, the inverting circuit 32 takes in RCS 3a and puts out an inverse of thereof. The NAND circuit 33 takes in RCS 3a and an output signal of the inverting circuit 31 and puts out a pulse signal 3c indicative of the result of the NAND operation. The AND circuit 34 takes in DCS 3b and an output signal of the inverting circuit 32 and puts out a pulse signal 3d indicative of the result of the AND operation. The PMOS transistor 35 has a source that is linked to a supply of power and a gate at which PULSE SIGNAL 3c of the NAND circuit 33 is applied. The NMOS transistor 36 has a source that is grounded, and a gate at which PULSE SIGNAL 3d of the AND circuit 34 is applied. The first buffer 37 takes in DCS 3b. The first buffer has an output signal line that is associated with the drains of the PMOS transistor 35 and the NMOS transistor 36. The second buffer 38 takes in an output signal of the first buffer 37 and puts out a post-correction drive clock signal (PDCS) 3e.

The operation of a CSWS having the above-described structure is now explained below.

Figure 12A:
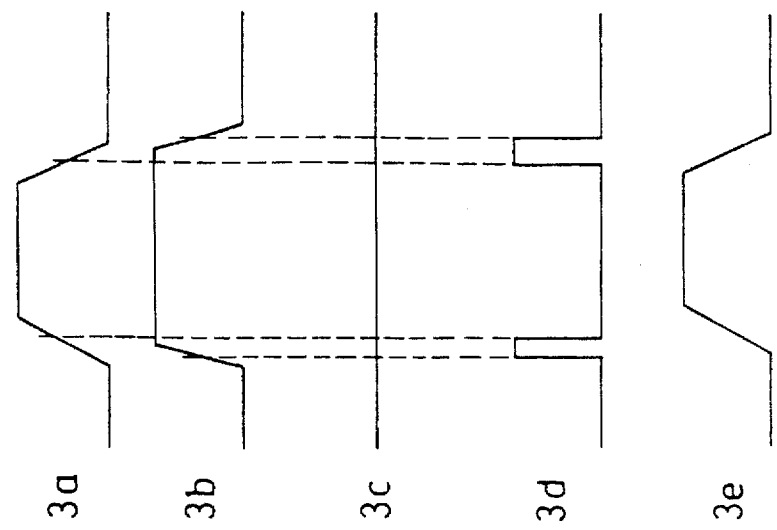
FIGS. 12(a) and (b) depict signal waveforms of the third embodiment CSWS.

FIG. 12(a) depicts signal waveforms of the present CSWS when the duty ratio of DCS 3b is lower than the duty ratio of RCS 3a.

PULSE SIGNAL 3c becomes LOW, only when RCS 3a is HIGH and DCS 3b is LOW. In other conditions, PULSE SIGNAL 3c becomes HIGH. PULSE SIGNAL 3d stays in the same logical state (i.e., LOW). When PULSE SIGNAL 3c is LOW, the PMOS transistor 35 becomes a source of electric current, whereupon a charge force is applied to the output signal line of the first buffer 37. This enables the duty ratio of PDCS 3e to become equal to the duty ratio of RCS 3a.

Figure 12B:
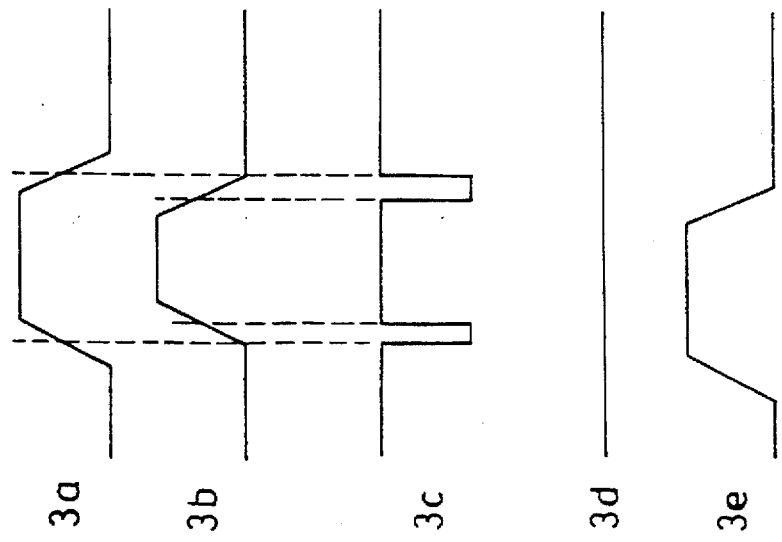

FIG. 12(b) depicts signal waveforms of the present CSWS when the duty ratio of DCS 3b is greater than the duty ratio of RCS 3a.

PULSE SIGNAL 3d becomes HIGH, only when RCS 3a is LOW and DCS 3b is HIGH. In other conditions, PULSE SIGNAL 3d becomes LOW. When PULSE SIGNAL 3d is HIGH, the NMOS transistor 36 becomes a source of electric current, whereupon a decharge force is applied to the output signal line of the first buffer 37. This enables the duty ratio of PDCS 3e to become equal to the duty ratio of RCS 3a.

As described above, the present embodiment enables the duty ratio of the drive clock signal to become equal to the duty ratio of the reference clock signal with a simple circuit structure.

The present CSWS makes it possible that correction of a drive clock signal is made in each circuit block in a semiconductor integrated circuit so as to guarantee the duty ratio of the drive clock signal. As a result of such arrangement, circuit malfunction caused by a duty ratio-unguaranteed clock signal can be prevented. This achieves the stability of circuit operations. This further achieves high-speed circuit performance.

Further, if the present CSWS is standard-cellized for incorporation in a random logic section or in an ASIC circuit, this easily accomplishes an integrated circuit capable of operating at high speed with greater stability.

Figure 13:
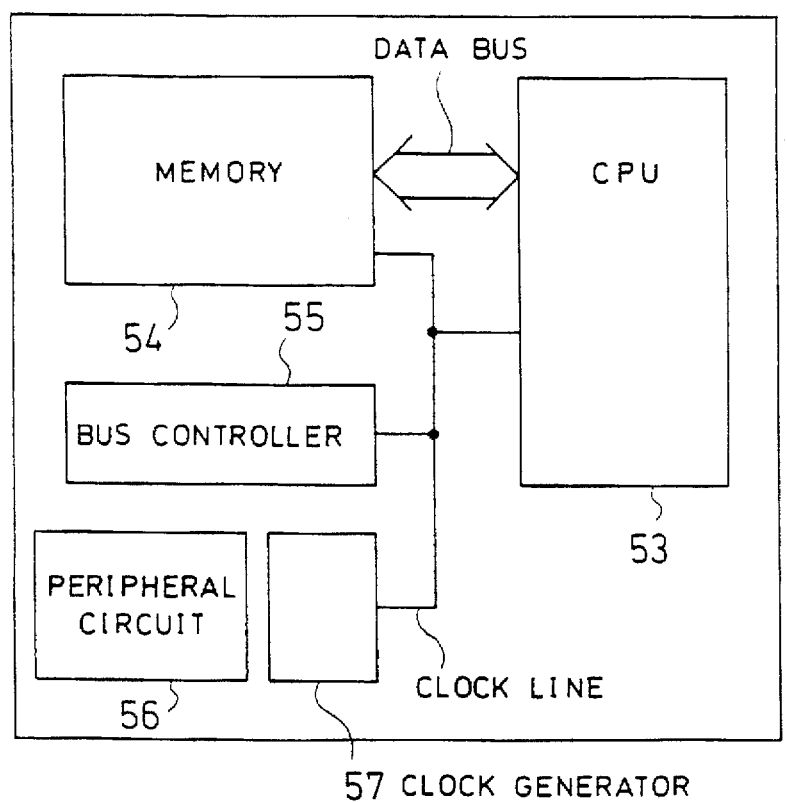
FIG. 13 is a circuit diagram outlining the structure of a microcontroller employing a CSWS according to the present invention.

FIG. 13 is a circuit diagram outlining the structure of a 32-bit microcontroller using a CSWS according to the present invention. This 32-bit microcontroller, made up of a CPU 53, a memory 54, a bus controller 55, and a peripheral circuit 56, operates at, for example, a frequency of 50 MHz according to clock signals generated by a clock generator 57. The CPU 53 and the memory 54 are connected together by a bus for data transmission therebetween. The CPU 53 is provided with a CSWS of the present invention.

Figure 14A:
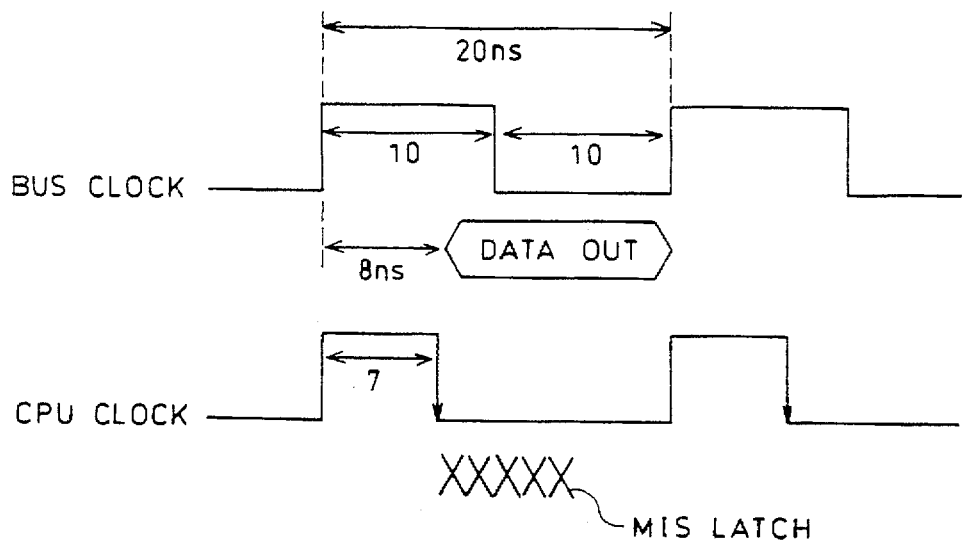
FIGS. 14(a) and (b) are diagrams showing the transmission of data between a CPU and a memory within the FIG. 13 microcontroller.
Figure 14B:
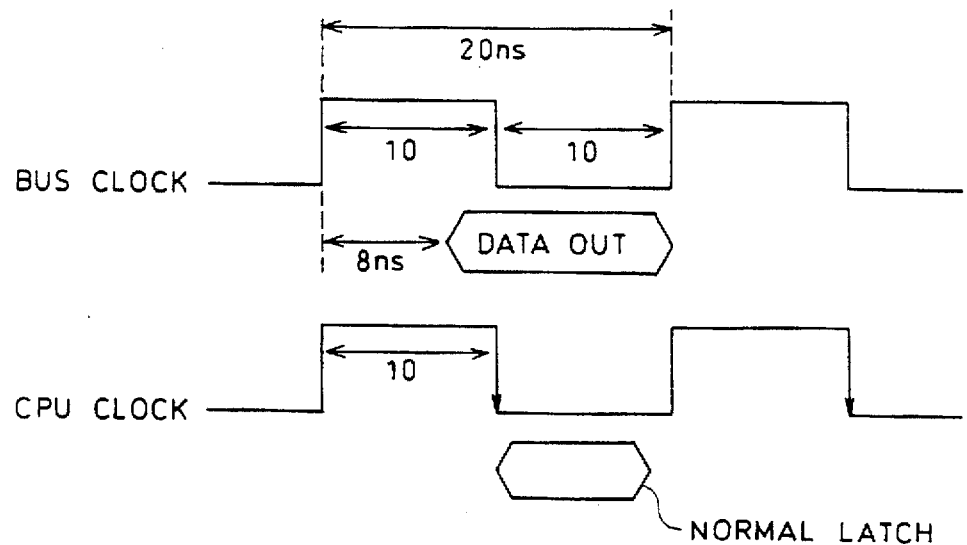
Figure 15A:
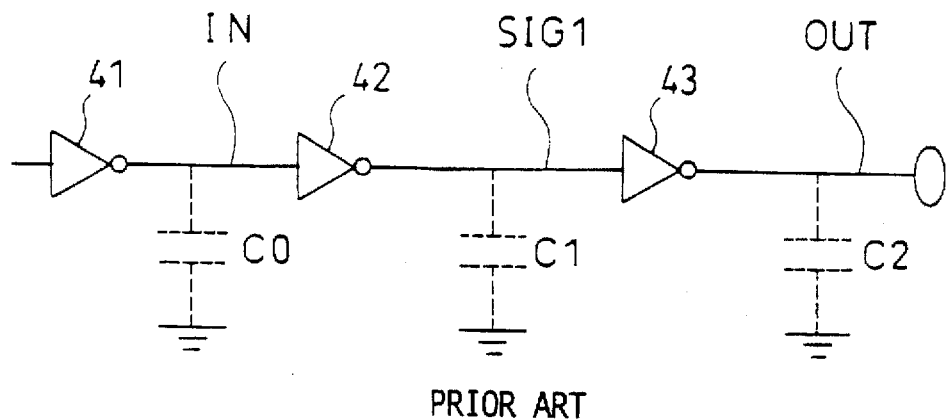
Figure 15B:
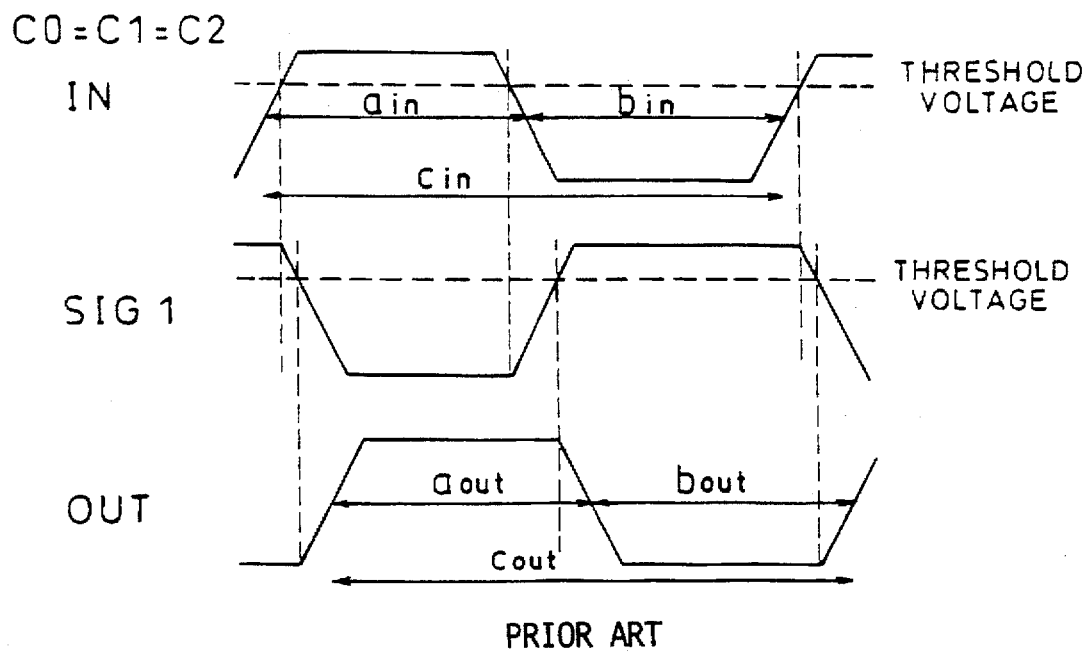
FIG. 15(b) depicts signal waveforms of the buffer.
Figure 16:
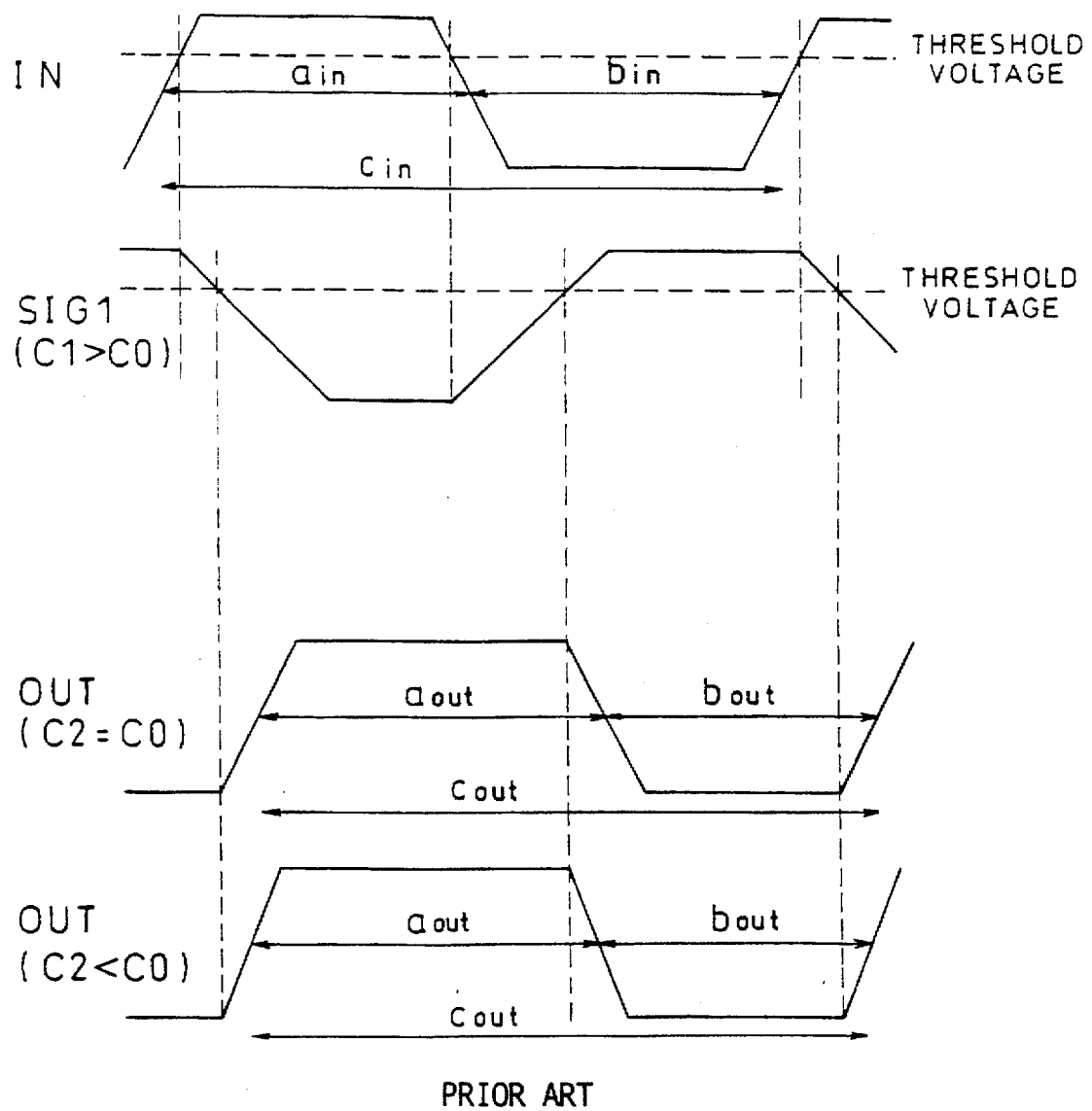
FIG. 16 depicts waveforms of the FIG. 15(a) buffer.
Figure 17:
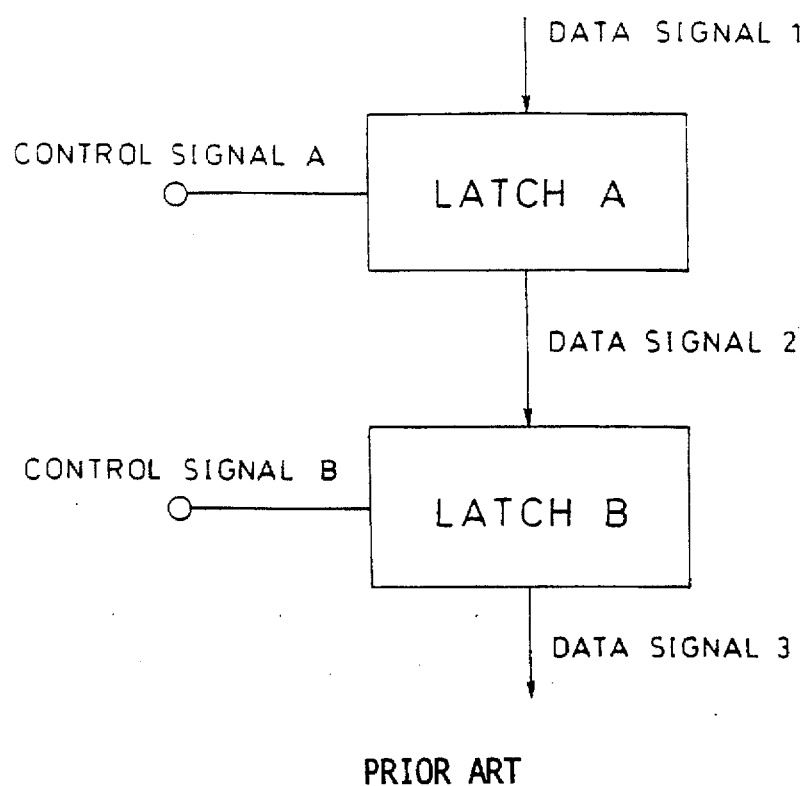
FIG. 17 is a block diagram of a data bus made up of two latches.

FIG. 14 is a diagram useful in understanding data transmission between the CPU 53 and the memory 54. Whereas FIG. 14(a) shows an example of the data mislatch, FIG. 14(b) shows an example of the normal operation. A bus clock and a CPU clock, each having a cycle of 20 ns and a duty ratio of 50%, are used, and the memory 54 provides data to the CPU 53 after an elapse of 8 ns from a bus clock rise. The CPU 53 latches data that is provided from the memory 54 when the CPU clock falls. If, at this time, the duty ratio of the CPU clock changes to 35%, and if the HIGH-level duration time becomes 7 ns, it is likely for a conventional microcontroller to suffer the occurrence of data mislatch as shown in FIG. 14(a). On the other hand, the FIG. 13 microcontroller is able to operate normally even in such conditions, since the CPU 53 has a CSWS of the present invention capable of providing a guaranteed CPU clock duty ratio.

The invention claimed is:

1. A clock signal waveform-correcting method, wherein a reference clock signal having a predetermined duty ratio and a drive clock signal are used in order that said drive clock signal is matched in duty ratio with said reference clock signal, said method comprising:

a first step of detecting at least one of a rise phase difference between said reference clock signal and said drive clock signal and a fall phase difference between said reference clock signal and said drive clock signal, and of generating a signal which shows a length of time during which said reference clock signal and said drive clock signal disagree in phase; and a second step of applying to said drive clock signal either a charge or a decharge for said length of time shown by said signal, wherein the duty ratio of said drive clock signal will thereby become matched with the duty ratio of said reference signal.

2. A clock signal waveform-correcting method according to claim 1 wherein said first step comprises:

detecting a rise phase difference between said reference clock signal and said drive clock signal, and a fall phase difference between said reference clock signal and said drive clock signal; and generating a signal which shows a first length of time during which said reference clock signal and said drive clock signal disagree in rise phase, and a second length of time during which said reference clock signal and said drive clock signal disagree in fall phase.

3. A clock signal waveform-correcting system wherein:

said system takes in a reference clock signal having a predetermined duty ratio and a drive clock signal, and operates such that said drive clock signal is matched in duty ratio with said reference clock signal, and said system comprising:

first means for detecting at least one of a rise phase difference between said reference clock signal and said drive clock signal, and a fall phase difference between said reference clock signal and said drive clock signal, and for generating a signal which shows a length of time during which said reference clock signal and said drive clock signal disagree in phase; and second means for applying to said drive clock signal either a charge or a discharge for said length of time shown by said signal, wherein the duty ratio of said drive clock signal will thereby become matched with the duty ratio of said reference clock signal.

4. A clock signal waveform-correcting system according to claim 3, said first means being capable of detecting a rise phase difference between said reference clock signal and said drive clock signal, and a fall phase difference between said reference clock signal and said drive clock signal; and said first means being capable of generating a signal which shows a first length of time during which said reference clock signal and said drive clock signal disagree in rise phase, and a second length of time during which said reference clock signal and said drive clock signal disagree in fall phase.

5. A clock signal waveform-correcting system according to claim 3, said first means comprising a phase comparator capable of making a comparison in logical level between said reference clock signal and said drive clock signal so as to provide a pulse signal indicative of a length of time during which said reference clock signal and said drive clock signal disagree in logical level;

said second means having:

a signal inverting circuit which inverts said drive clock signal to produce an inverted signal;

a switch circuit which allows said inverted signal to be transmitted to a signal line for said drive clock signal, just for said length of time indicated by said pulse signal of said phase comparator.

6. A clock signal waveform-correcting system according to claim 5, said second means further including:

a first buffer which takes in said drive clock signal and which has an output signal line that is associated with a signal line for said inverted signal;

a second buffer which takes in an output signal of said first buffer and which puts out a post-correction drive clock signal.

7. A clock signal waveform-correcting system according to claim 3, said first means including:

(a) a rise phase comparator capable of:

making a comparison in rise timing between said reference clock signal and said drive clock signal;

providing a first pulse signal indicative of a first length of time during which said reference clock signal is in the rise state and, at the same time, said drive clock signal is out of the rise state, and a second pulse signal indicative of a second length of time during which said drive clock signal is in the rise state and, at the same time, said reference clock signal is out of the rise state;

(b) a fall phase comparator capable of:

making a comparison in fall timing between said reference clock signal and said drive clock signal;

providing a third pulse signal indicative of a third length of time during which said reference clock signal is in the fall state and, at the same time, said drive clock signal is out of the fall state, and a fourth pulse signal indicative of a fourth length of time during which said drive clock signal is in the fall state and, at the same time, said reference clock signal is out of the fall state;

said second means including:

(c) first electric current supply means for charging up a signal line for said drive clock signal just for said first length of time;

(d) second electric current supply means for decharging said signal line just for said second length of time;

(e) third electric current supply means for decharging said signal line just for said third length of time;

(f) fourth electric current supply means for charging up said signal line just for said fourth length of time.

8. A clock signal waveform-correcting system according to claim 7, each of said first to fourth electric current supply means including:

an electric current source for supplying an electric current either to charge up said signal line or to decharge said signal line;

a switch circuit for allowing said electric current source to supply an electric current to said signal line just for a length of time indicated by a pulse signal inputted.

9. A clock signal waveform-correcting system according to claim 8, said second means including:

a first buffer which takes in said drive clock signal and which has an output signal line that is associated with current supply lines of said switch circuits, respectively;

a second buffer which takes in an output signal of said first buffer and puts out a post-correction drive clock signal.

10. A clock signal waveform-correcting system according to claim 3, said first means including:

a first circuit for making a comparison in logical level between said reference clock signal and said drive clock signal, and for providing a first pulse signal indicative of a first length of time during which said reference clock signal is at the logical level of HIGH and, at the same time, said drive clock signal is at the logical level of LOW;

a second circuit for making a comparison in logical level between said reference clock signal and said drive clock signal, and for providing a second pulse signal indicative of a second length of time during which said reference clock signal is at the logical level of LOW and, at the same time, said drive clock signal is at the logical level of HIGH;

said second means including:

first electric current supply means for charging up a signal line for said drive clock signal, just for said first length of time;

second electric current supply means for discharging said signal line, just for said second length of time.

11. A clock signal waveform-correcting system according to claim 10, said second means including:
a first buffer which takes in said drive clock signal and which has an output signal line that is associated with current supply lines of said first and second electric current supply means, respectively;
a second buffer which takes in an output signal of said first buffer and puts out a post-correction drive clock signal.

12. A semiconductor integrated circuit comprising:

a clock signal waveform-correcting system that takes in a reference clock signal having a predetermined duty ratio and a drive clock signal, and operates such that said drive clock signal is matched in duty ratio with said reference clock signal;

said clock signal waveform-correcting system including:
first means for detecting at least one of a rise phase difference between said reference clock signal and said drive clock signal and a fall phase difference between said reference clock signal and said drive clock signal, and for generating a signal which shows a length of time during which said reference clock signal and said drive clock signal disagree in phase; and
second means for applying to said drive clock signal either a charge or a decharge for said length of time shown by said signal, wherein the duty ratio of said drive clock signal will thereby become matched with the duty ratio of said reference signal.

13. A semiconductor integrated circuit according to claim 12, said first means being formed by a phase comparator capable of making a comparison in logical level between said reference clock signal and said drive clock signal so as to provide a pulse signal indicative of a length of time during which said reference clock signal and said drive clock signal disagree in logical level;

said second means having:
a signal inverting circuit which inverts said drive clock signal to produce an inverted signal;
a switch circuit which allows said inverted signal to be transmitted to a signal line for said drive clock signal, just for said length of time indicated by said pulse signal of said phase comparator.

14. A semiconductor integrated circuit according to claim 12, said first means including:
(a) a rise phase comparator capable of:
making a comparison in rise timing between said reference clock signal and said drive clock signal;
providing a first pulse signal indicative of a first length of time during which said reference clock signal is in the rise state and, at the same time, said drive clock signal is out of the rise state, and a second pulse signal indicative of a second length of time during which said drive clock signal is in the rise state and, at the same time, said reference clock signal is out of the rise state;
(b) a fall phase comparator capable of:
making a comparison in fall timing between said reference clock signal and said drive clock signal;
providing a third pulse signal indicative of a third length of time during which said reference clock signal is in the fall state and, at the same time, said drive clock signal is out of the fall state, and a fourth pulse signal indicative of a fourth length of time during which said drive clock signal is in the fall state and, at the same time, said reference clock signal is out of the fall state;

said second means including:
(c) first electric current supply means for charging up a signal line for said drive clock signal just for said first length of time;
(d) second electric current supply means for decharging said signal line just for said second length of time;
(e) third electric current supply means for decharging said signal line just for said third length of time;
(f) fourth electric current supply means for charging up said signal line just for said fourth length of time.

15. A semiconductor integrated circuit according to claim 12, said first means including:
a first circuit for making a comparison in logical level between said reference clock signal and said drive clock signal, and for providing a first pulse signal indicative of a first length of time during which said reference clock signal is positive and, at the same time, said drive clock signal is negative;
a second circuit for making a comparison in logical level between said reference clock signal and said drive clock signal, and for providing a second pulse signal indicative of a second length of time during which said reference clock signal is negative and, at the same time, said drive clock signal is positive;

said second means including:
first electric current supply means for charging up a signal line for said drive clock signal, just for said first length of time;
second electric current supply means for decharging said signal line, just for said second length of time.

* * * * *